United States Patent
Scott

(10) Patent No.: US 10,284,141 B2
(45) Date of Patent: May 7, 2019

(54) APPARATUS AND METHOD FOR COMPENSATING A LOAD-PULLED OSCILLATOR

(71) Applicant: Phase Dynamics, Inc., Richardson, TX (US)

(72) Inventor: Bentley N. Scott, Garland, TX (US)

(73) Assignee: Phase Dynamics, Inc., Richardson, TX (US)

( * ) Notice: Subject to any disclaimer, the term of this patent is extended or adjusted under 35 U.S.C. 154(b) by 336 days.

(21) Appl. No.: 15/175,750

(22) Filed: Jun. 7, 2016

(65) Prior Publication Data

US 2017/0012582 A1 Jan. 12, 2017

Related U.S. Application Data

(63) Continuation-in-part of application No. 15/171,643, filed on Jun. 2, 2016.

(60) Provisional application No. 62/189,307, filed on Jul. 7, 2015.

(51) Int. Cl.
*H03B 5/04* (2006.01)
*H03B 5/12* (2006.01)

(52) U.S. Cl.
CPC .............. *H03B 5/04* (2013.01); *H03B 5/1203* (2013.01); *H03B 2200/0062* (2013.01); *H03B 2202/08* (2013.01)

(58) Field of Classification Search
None
See application file for complete search history.

(56) References Cited

U.S. PATENT DOCUMENTS

| | | | | |
|---|---|---|---|---|
| 4,734,594 A | * | 3/1988 | Nelson | H03K 17/90 323/368 |
| 4,996,490 A | | 2/1991 | Scott et al. | |
| 5,107,219 A | | 4/1992 | Marrelli et al. | |
| 5,550,469 A | * | 8/1996 | Tanabe | G01R 33/06 324/225 |
| 5,926,024 A | * | 7/1999 | Blount | G01N 22/00 324/324 |
| 6,338,359 B1 | | 1/2002 | Welker | |
| 7,135,870 B2 | * | 11/2006 | Mohajer | G01N 22/00 324/639 |

(Continued)

OTHER PUBLICATIONS

U.S. Appl. No. 15/171,643 Non-final Office Action dated Jan. 26, 2018 in related application.

*Primary Examiner* — Peter J Macchiarolo
*Assistant Examiner* — Jermaine L Jenkins

(57) ABSTRACT

A load pulled oscillator circuit. The load pulled oscillator circuit comprises: i) an active circuit comprising a load pulled oscillator transistor, the active circuit having an optimal operational bias point; ii) an impedance matching circuit coupled to the active circuit; and iii) a temperature compensation circuit coupled to the active circuit and configured to compensate a bias voltage to the active circuit to thereby maintain the optimal operational bias point. The temperature compensation circuit comprises a thermistor that provides a variable resistance according to an ambient temperature in which the active circuit operates. The variable resistance of the thermistor compensates for changes in the ambient temperature to thereby maintain the optimal operational bias point.

3 Claims, 10 Drawing Sheets

(56) References Cited

U.S. PATENT DOCUMENTS

| | | | |
|---|---|---|---|
| 8,183,928 B2* | 5/2012 | Kim | H03F 1/30 |
| | | | 330/285 |
| 8,188,794 B2* | 5/2012 | Lautzenhiser | H03F 1/301 |
| | | | 330/285 |
| 9,176,083 B2* | 11/2015 | Surman | G01N 27/026 |
| 9,287,824 B2* | 3/2016 | Pohl | H03B 5/1243 |
| 9,658,178 B2* | 5/2017 | Surman | G01N 27/023 |
| 2005/0264302 A1 | 12/2005 | Mohajer et al. | |

* cited by examiner

← 710

← 720

APPARATUS AND METHOD FOR COMPENSATING A LOAD-PULLED OSCILLATOR

CROSS-REFERENCE TO RELATED APPLICATION(S) AND CLAIM OF PRIORITY

The present application is related to U.S. Provisional Patent No. 62/189,307, entitled "Analyzer With Embedded Measurement Electronics", and filed on Jul. 7, 2015. Provisional Patent No. 62/189,307 is assigned to the assignee of the present application and is hereby incorporated by reference into the present application as if fully set forth herein. The present application claims priority under 35 U.S.C. § 119(e) to U.S. Provisional Patent No. 62/189,307.

The present application is a continuation-in-part of U.S. patent application Ser. No. 15/171,643, entitled "Fluid Phase Analyzer With Embedded Measurement Electronics", filed on Jun. 2, 2016. Application Ser. No. 15/171,643 is assigned to the assignee of the present application and is hereby incorporated by reference into the present application as if fully set forth herein. The present application hereby claims priority under 35 U.S.C. § 120 to U.S. patent application Ser. No. 15/171,643.

TECHNICAL FIELD

The present disclosure relates generally to apparatuses and methods for measuring multiphase fluids and, in particular, to improved load-pulled oscillators for use in multiphase fluid measuring devices for measuring the amount of oil, water, and gas in a pipeline.

BACKGROUND

Crude petroleum oil and gaseous hydrocarbons are produced by extraction from subterranean reservoirs. In reservoirs with enough natural pressure, oil and gas flows to the surface without secondary lift techniques. Often, however, other methods are required to bring them to the surface. These include a variety of pumping, injection, and lifting techniques used at various locations, such as at the surface wellhead (e.g., rocking beam suction pumping), at the bottom of the well (e.g., submersed pumping), with gas injection into the well casing creating lift, and other techniques. Each technique results in oil and gas emerging from the well head as a multiphase fluid with varying proportions of oil, water, and gas. For example, a gas lift well has large volumes of gas associated with the well. The gas-to-oil volume ratios can be 200 cubic feet or more of gas per barrel. Large measurement uncertainties may occur, depending upon the methods used.

The measurement of water in petrochemical products is a common practice in the petroleum industry. This measurement is frequently done in combination with oil well testing to assist in optimizing oil production from a single oil well or a series of oil wells. The measurement may also be performed during the transfer of crude petroleum oil, as occurs during the production, transport, refining, and sale of oil. Specifically, it is well known to a person having ordinary skill in the art of petroleum engineering that crude petroleum oil emerging from production wells can contain large amounts of water, ranging from generally about 1% to as high as about 95% water. This value is known as the water cut ("WC"). Multiphase measurements typically provide an oil company and other stakeholders with the amount of gas, oil, and water and the average temperature, pressure, gas/oil ratio, and gas volume fraction that a well produces in a day.

Typical techniques to determine the water percentage or water cut is to use a capacitive, radio frequency, or microwave analyzer to perform the in-line monitoring of the oil and water mixture within a pipeline. U.S. Pat. No. 4,862,060 to Scott, entitled "Microwave Apparatus for Measuring Fluid Mixtures", discloses microwave apparatuses and methods which are most suitable for monitoring water percentages when the water is dispersed in a continuous oil phase. U.S. Pat. No. 4,862,060 is hereby incorporated by reference as if fully set forth herein.

It is well known to electrical engineers and particularly microwave engineers that the frequency of a radio frequency (RF) oscillator can be "pulled" if the oscillator sees an impedance which is different from the ideal matched impedance. That is, the RF oscillator is pulled or shifted from the frequency of oscillation which would be seen if the oscillator were coupled to an ideal impedance-matched pure resistance. Thus, varying the load impedance may cause the oscillator frequency to shift. U.S. Pat. Nos. 4,862,060 and 4,996,490 describe the application of load pull oscillators in detail.

For example, an unbuffered RF oscillator is loaded by an electromagnetic propagation structure which is electromagnetically coupled, by proximity, to a material for which real-time monitoring is desired. The net complex impedance seen by the oscillator varies as the characteristics of the material in the electromagnetic propagation structure varies. As this complex impedance changes, the oscillator frequency varies. Thus, the frequency variation, which can easily be measured, reflects changes in density (e.g., due to bonding changes, additional molecular chains, etc.), ionic content, dielectric constant, or microwave loss characteristics of the medium under study (i.e., the multiphase fluid). These changes "pull" the resonant frequency of the oscillator system. Changes in the magnetic permeability of the medium will also tend to cause a frequency change, since the propagation of the RF energy is an electromagnetic process which is coupled to both electric fields and magnetic fields within the transmission line.

Load-pulled oscillators, which make use of this effect, are an important technique for RF monitoring. A free-running oscillator, typically at VHF or higher frequencies, is electromagnetically coupled to some environment which is to be characterized or analyzed. For example, an unknown oil/water/gas composition may flow through a coaxial probe element. Since the oscillator is not isolated from the environment being measured, changes in that environment pull the frequency of oscillation. By monitoring shifts in the frequency of oscillation, changes in the environment being monitored may be measured with great precision. For example, in compositional monitoring of wellhead flows of oil/gas/water mixtures, the environment being monitored is a medium having a variable composition and changes in the composition are seen as shifts in the oscillation frequency for a given tuning voltage.

The oil industry covers every possible climate condition across the world. This requires temperature compensation circuitry to be included in any electronic multiphase analyzer. By way of example, U.S. Pat. Nos. 4,862,060, 4,996, 490, 5,748,002, 6,593,753, and others describe the use of load pulled oscillators that use a plate heated to 80 degrees Celsius under the temperature sensitive oscillator portion of the circuitry to eliminate the ambient temperature from being seen by the components. This method is effective but forces the use of 30 watts of power in a cold environment.

This prevents the use of intrinsically safe circuits and is demanding on the power supply. U.S. Pat. Nos. 4,862,060, 4,996,490, 5,748,002, 6,593,753 are hereby incorporated by reference as if fully set forth herein.

U.S. Pat. No. 6,867,599 describes a circuit and method to compensate a load pulled oscillator for temperature variation by using a reference load and tuning the oscillator with a voltage to achieve the same frequency for a given reference load. U.S. Pat. Nos. 6,687,599 4,862,060 is hereby incorporated by reference as if fully set forth herein. Although effective, this approach has several disadvantages. Any noise on the lines for the tuning circuits from the microprocessor or other noise sources will alter the ability to set the operating point. Changing the external capacitance in the oscillator feedback loop using a varactor might alter the load pull characteristic impedance. The added circuitry required to accomplish the load switching increases the attenuation between the oscillator and the load, thereby reducing the ability of the oscillator to change frequency. This reduces the advantage that the load pull characteristic provides.

Therefore, there is a need for improved systems and methods for measuring the water cut of a multiphase fluid. In particular, there is a need for a multiphase fluid analyzer capable of taking accurate water cut measurements across a wide spectrum of operating temperatures. More particularly, there is a need for apparatuses and methods to effectively correct the ambient temperature effects for a load pulled oscillator which reduces the complexity of the method described in U.S. Pat. No. 6,867,599.

SUMMARY

To address the above-discussed deficiencies of the prior art, it is a primary object to provide a load pulled oscillator circuit comprising: i) an active circuit comprising a load pulled oscillator transistor, the active circuit having an optimal operational bias point; ii) an impedance matching circuit coupled to the active circuit; and iii) a temperature compensation circuit coupled to the active circuit and configured to compensate a bias voltage to the active circuit to thereby maintain the optimal operational bias point. The temperature compensation circuit comprises a thermistor that provides a variable resistance according to an ambient temperature in which the active circuit operates. The variable resistance of the thermistor compensates for changes in the ambient temperature to thereby maintain the optimal operational bias point.

In one embodiment, the load pulled oscillator transistor comprises one of: i) a biased junction transistor, wherein the temperature compensation circuit is coupled to a base of the biased junction transistor; and ii) a field effect transistor, wherein the temperature compensation circuit is coupled to a gate of the field effect transistor.

In another embodiment, the load pulled oscillator transistor comprises one of: i) a biased junction transistor, wherein the temperature compensation circuit is coupled to a collector of the biased junction transistor; and ii) a field effect transistor, wherein the temperature compensation circuit is coupled to a drain of the field effect transistor.

In still another embodiment, the load pulled oscillator transistor comprises one of: i) a biased junction transistor, wherein the temperature compensation circuit is coupled to an emitter of the biased junction transistor; and ii) a field effect transistor, wherein the temperature compensation circuit is coupled to a source of the field effect transistor.

In yet another embodiment, the load pulled oscillator transistor comprises a biased junction transistor, wherein the temperature compensation circuit is coupled to a base of the biased junction transistor, and further comprises at least a second thermistor coupled to at least one of a collector of the biased junction transistor and an emitter of the biased junction transistor.

In a further embodiment, the load pulled oscillator transistor comprises a field effect transistor, wherein the temperature compensation circuit is coupled to a gate of the field effect transistor, and further comprises at least a second thermistor coupled to at least one of a source of the field effect transistor and a drain of the field effect transistor.

It is another primary object to provide a load pulled oscillator circuit comprising: i) an active circuit comprising a load pulled oscillator transistor, the active circuit having an optimal operational bias point; ii) an impedance matching circuit coupled to the active circuit; and iii) a temperature compensation circuit coupled to the active circuit and configured to compensate a bias voltage to the active circuit to thereby maintain the optimal operational bias point. The temperature compensation circuit comprises a temperature compensation transistor matched to the load pulled oscillator transistor. A gain value of the temperature compensation transistor varies with changes in an ambient temperature in which the active circuit operates such that the temperature compensation transistor compensates for changes in the ambient temperature to thereby maintain the optimal operational bias point.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
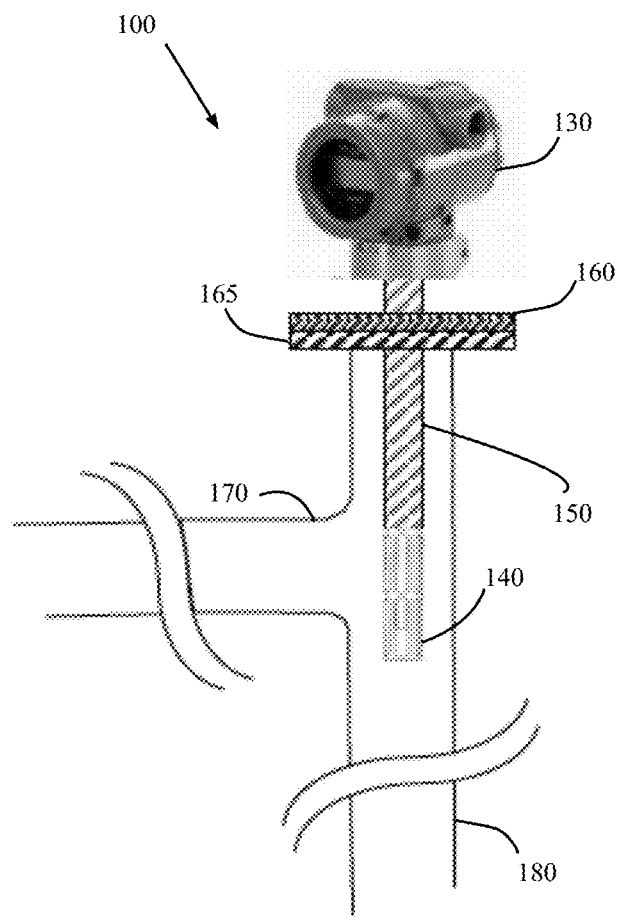
FIG. 1 illustrates a fluid phase analyzer according to the present disclosure.

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged load-pulled oscillator.

The present disclosure generally relates to systems and methods for measuring the amount of one phase in a mixture of phases and, more particularly, to measuring the amount of water present in crude petroleum oil. This disclosure describes an apparatus in which the measurement electronics are embedded in the shaft of the analyzer that is inserted into the multiphase fluid. This system configuration reduces the parasitic length found in the prior art from affecting the measurement, thereby providing more accurate and reproducible measurements. This configuration also improves the ability to measure at higher frequencies, thereby providing increased resolution of measurement. In the prior art phase analyzers, the added length of the waveguide would be detrimental due to the radio frequency (RF) losses and phase lengths involved.

Some embodiments of the disclosed apparatus are methods and systems for determining the amount of water in crude petroleum oil. As crude petroleum oil is held over time, gravitationally-induced separation of water-continuous and oil-continuous phases can occur. At least some of the properties of the separated phases can be used to generate water and oil property values which in turn can be used to provide improved water percentage determinations of crude petroleum oil.

Some embodiments of the disclosed apparatus are used to determine the water fraction and the oil fraction in an oil and water mixture which has been subjected to gravity and un-agitated storage. For example, the disclosed apparatus may be used to sample, measure, and analyze petroleum being off-loaded from a transport tanker, in which some gravitationally-induced phase separation of a water-continuous phase and an oil-continuous phase has occurred in the hold during transit. Also, the disclosed apparatus may be used to measure and to characterize crude petroleum oils being pumped from a storage vessel, in which some gravitationally-induced phase separation of a water-continuous phase and an oil-continuous phase has occurred in the tank during storage. Some embodiments of the disclosed apparatus are used to determine the level in a stored oil tank. This is especially used during water draw from the bottom of the tank to determine when to stop the water flow.

The disclosed innovations, in various embodiments, provide one or more of at least the following advantages: i) some of the measurement electronics are moved down to the measurement area to improve the confidence level in determining the amount of water in crude petroleum oil; ii) improved measurement due to reduction of the attenuation between the signal source and the measurement area; iii) a reduction of the phase length of the signal between the signal source and the measurement area; iv) compensation for the ambient change of temperature with respect to the operating point of the measurement electronics using a temperature sensing element; and v) real-time reduction of errors and supplying more accurate results, thereby aiding near-real-time decision-making or automatic flow diversion, without requiring oil stream sampling or off-line lab-work, thereby reducing cost, lost opportunities, and hazards associated with such sampling.

FIG. 1 illustrates fluid phase analyzer 100 according to an embodiment of the present disclosure. Fluid phase analyzer 100 comprises electronics housing 130, ground cage 140, variable-length extension shaft 150, and flange 160. Ground cage 140 and extension shaft 150 are inserted through flange 165 into a "T-shaped" pipe section comprising pipeline 170 and pipeline 180. Flange 165 is welded to the T-shaped pipe section. Extension shaft 150 may be welded through a hole in flange 160 so that when flange 160 is bolted or welded onto flange 165, a fluid-tight seal is created. However, electronics housing 130 remain outside of the T-shaped pipeline in the ambient air temperature, while only extension shaft 150 and ground cage 140 are immersed in the multiphase fluid inside of the T-shaped pipe section.

In an exemplary embodiment, ground cage 140 comprises a coaxial shaft with a ceramic center rod, wherein an antenna is disposed inside of the ceramic rod. The ceramic rod allows RF wave propagation through water continuous (conductive) emulsions and is thick enough to allow electrical propagation while establishing the current (magnetic) propagation through the conductive medium as described in U.S. Pat. No. 4,862,060, incorporated by reference above. In an exemplary embodiment, one or both of ground cage 140 and extension shaft 150 may be metal tubes that are cylindrical in shape (i.e., circular cross-sectional area). However, in alternate embodiments, one or both of ground cage 140 and extension shaft 150 may have a differently shaped cross-sectional area, including oval, triangular, rectangular, and the like.

Figure 2:
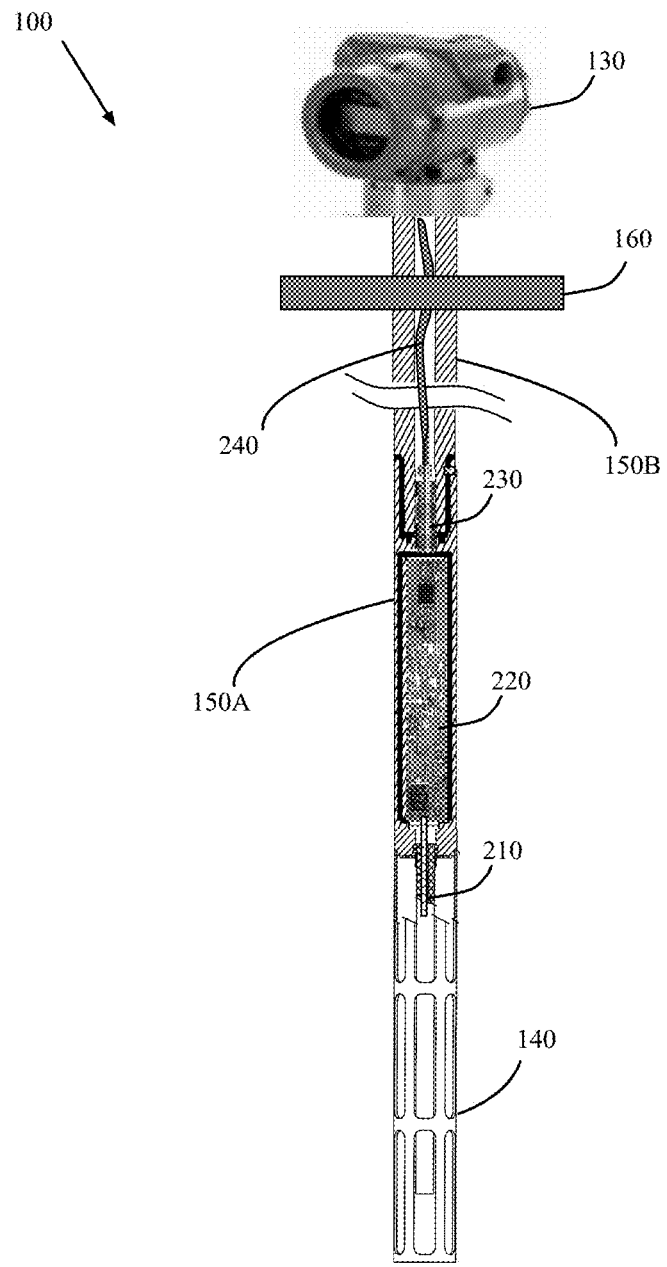
FIG. 2 illustrates the fluid phase analyzer of FIG. 1 in greater detail according to an embodiment of the present disclosure.

FIG. 2 illustrates fluid phase analyzer 100 in greater detail according to an embodiment of the present disclosure. In the exemplary embodiment, extension shaft 150 actually comprises two sections: measurement electronics section 150A and extension section 150B. Measurement electronics section 150A is threaded onto extension section 150B. The length of extension section 150B varies according to how deep the sensor in ground cage 140 must be inserted into a multiphase fluid in a particular implementation.

Measurement electronics section 150A comprises circuit board 220 (shown in a top view), which is coupled at one end to sensor 210 in ground cage 140. As noted above, sensor 220 comprises a ceramic center rod, wherein a coaxial antenna is disposed inside of the ceramic rod. Measurement electronics section 150A is coupled at the other end by connector 230 to cable 240. Cable 240 is, in turn, coupled to, for example, a microcontroller and a transceiver inside electronics housing 130. Cable 140 may comprise, among others, a power line, a ground line, and a twisted pair signal line for communicating with the circuitry inside electronics housing 130.

Figure 3:
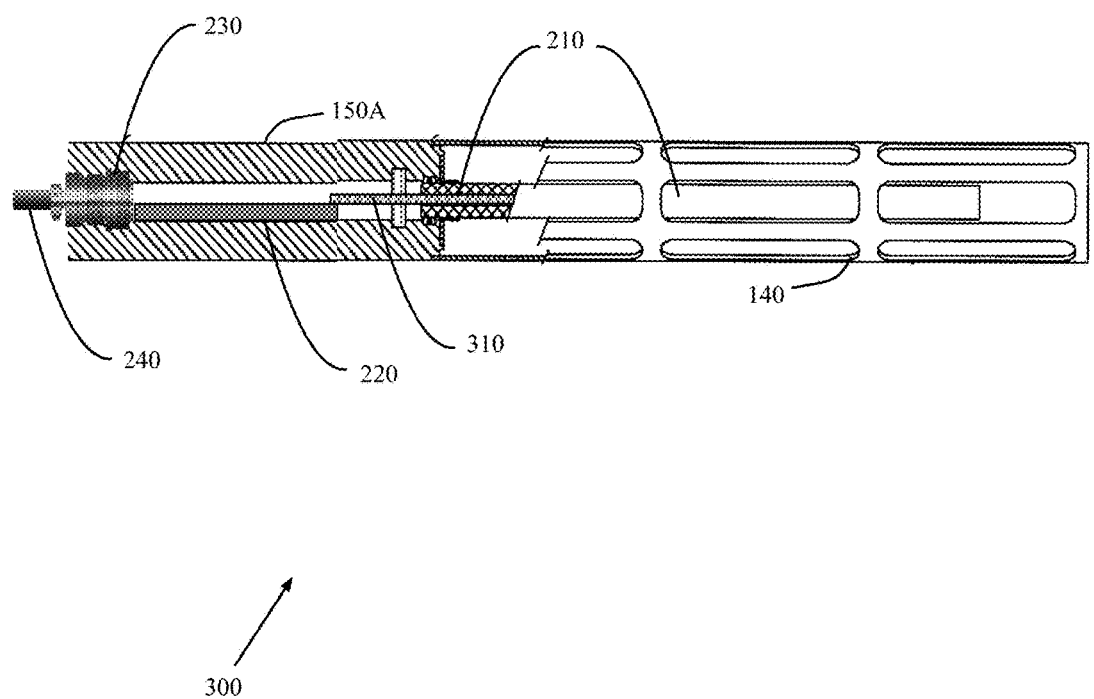
FIG. 3 illustrates selected portions of the fluid phase analyzer of FIG. 1 in greater detail according to an embodiment of the present disclosure.

FIG. 3 illustrates selected portions of fluid phase analyzer 100 in greater detail according to an embodiment of the present disclosure. FIG. 3 provides a side view of circuit board 220. Antenna 310 is coupled to circuitry on circuit board 220 and is inserted into the ceramic body of sensor 210, which extends into ground cage 140. More generally, sensor 210 may comprise any antenna structure that provide electromagnetic propagation and may include non-ceramic materials.

Figure 4:
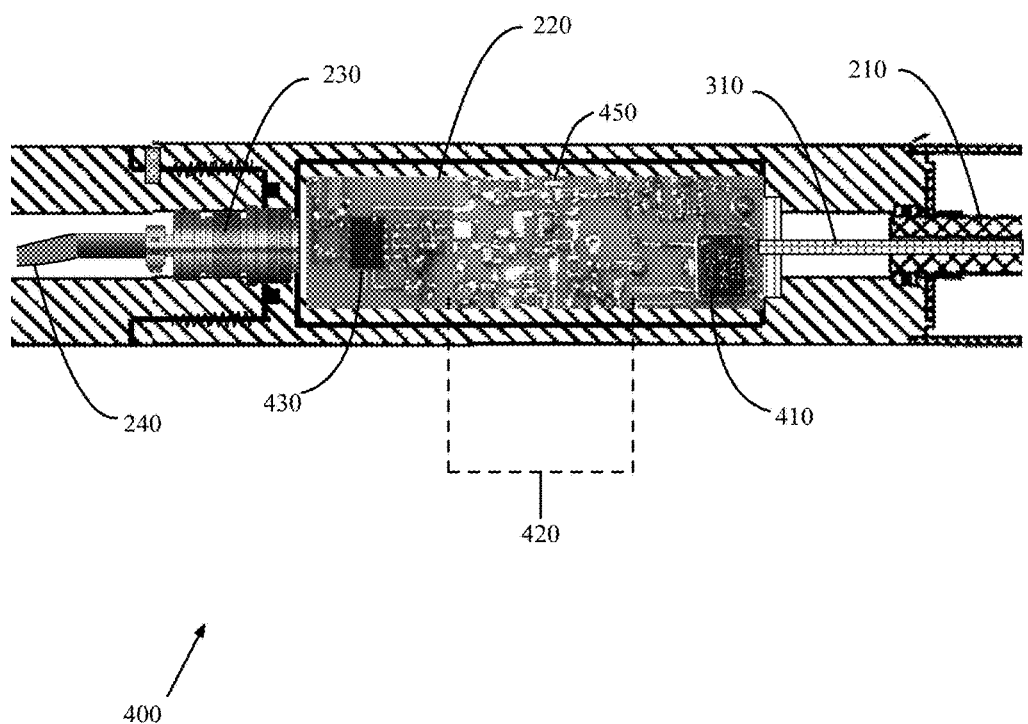
FIG. 4 illustrates selected portions of the fluid phase analyzer of FIG. 1 in greater detail according to an embodiment of the present disclosure.

FIG. 4 illustrates selected portions of fluid phase analyzer 100 in greater detail according to an embodiment of the present disclosure. As shown in FIG. 4, circuit board 220 comprises radio frequency (RF) transceiver circuitry 410, sampling and measurement circuitry 420, input-output (I/O) interface circuitry 430, and temperature sensing element 450. More generally, temperature sensing element 450 may comprise any element capable of measuring the apparent fluid temperature, such as a resistive temperature device (RTD), in order to compensate for the variations in the RF/microwave properties of the oil and water. For example, an Analog Devices AD592 may be used to measure temperature. In alternate embodiments, temperature sensing element 450 may comprise any one of a number of different types of thermistors. RF transceiver circuitry 410 drives coaxial antenna 310 with an RF signal and receives from antenna 310 reflected RF signals. Sampling and measurement circuitry 420 measures the reflected signals received from antenna 310 to determine power measurements, phase detection, and/or load pull measurement. I/O interface circuitry communicates with sampling and measurement circuitry 420 and the circuitry in electronics housing 130 to relay measurement data to electronics housing 130 and receive command signals and configuration data from electronics housing 130. Temperature sensing element 450 provides compensation for local temperature and local temperature measurement.

By way of example, in accordance with the apparatus disclosed in column 4 of U.S. Pat. No. 4,996,490, sampling and measurement circuitry 420 may comprise a microwave or radio frequency range signal generator connected to antenna 310 for generating a high frequency signal which may be varied by a voltage controlled oscillator tuning circuit. A signal receiver monitors the change in frequency caused by impedance pulling of the oscillator due to the change in fluid dielectric constant and transmits a differential frequency signal to a frequency counter and microprocessor for comparison of the measured signal with known reference signals for determining the percentage of water and oil in the multiphase fluid.

Measurement electronics section 150A is sealed in two places—by the ceramic-to-metal seal formed by sensor 210 at one end and by the welded connector 230 at the other end. Extension section 150B attaches to measurement electronics section 150 on one end and to electronic housing 130 on the other end and may be of any length and flange type at the process connection. The threads connecting measurement electronics section 150A and extension section 150B are O-ring sealed and may be locked into position with Allen screws or other methods to capture the two pieces. Extension section 150B may be made smaller than measurement electronics section 150A for convenient installation since extension section 150B only needs to be capable of withstanding the process and flange pressures and stresses. Measurement electronics section 150A becomes a totally sealed unit capable of operation in the severe oilfield environment. In addition, the circuitry may be intrinsically safe to prevent any potential hazard from occurring if the process seal is compromised.

Figure 5:
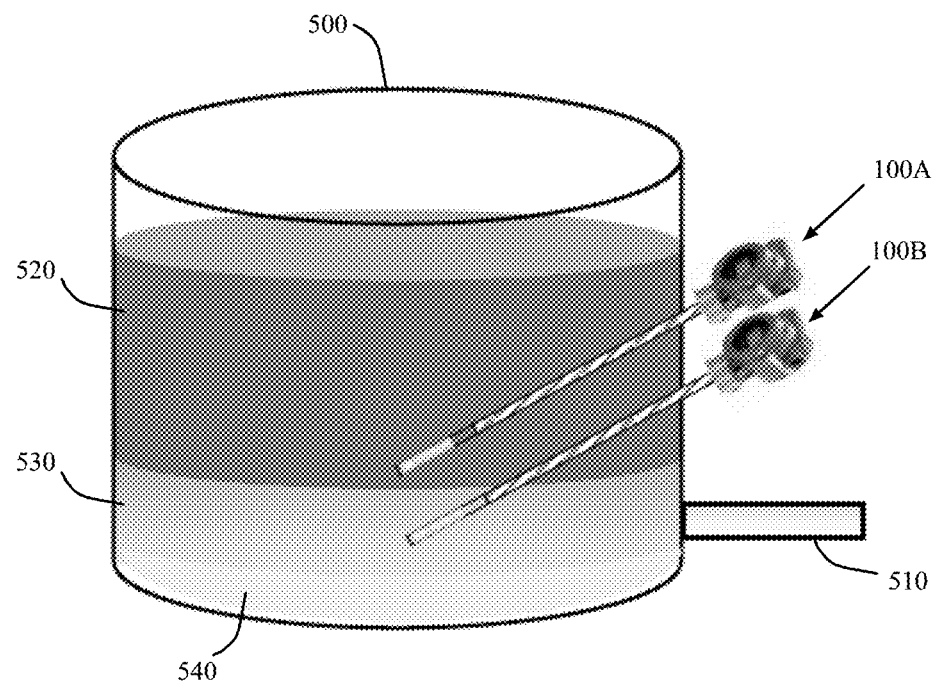
FIG. 5 illustrates a plurality of the fluid phase analyzers used to analyze multiphase fluids in a reservoir according to an embodiment of the present disclosure.

FIG. 5 illustrates a plurality of fluid phase analyzers 100A and 100B being used to analyze multiphase fluids in a reservoir according to an embodiment of the present disclosure. Within petroleum tank 500, oil layer 520 is separated from water layer 540 by emulsion layer 530. Outlet pipe 510 draws free water off the bottom of tank 500. FIG. 5 shows the measurement electronic sections of fluid phase analyzers 100A and 100B deep within petroleum tank 500. This is accomplished by using very long extension sections 150. This embodiment uses two fluid phase analyzers 100A and 100B to indicate when the interface (i.e., emulsion layer 530) between oil layer 520 and water layer 540 comes past the sensors in order to shut the draw valve (not shown) on outlet pipe 510 before oil is delivered to the water clean-up facility. If the oil content is too high (typically more than 5%), this may clog the floatation cells.

Existing capacitance interface probes are not capable of making measurements at high water content when the emulsion is in the oil continuous emulsion phase. Prior art devices will measure 100% water when the emulsion is oil continuous and high in water content (75% and above depending upon the oil). These high water, oil continuous emulsions are sometimes called "rag layers" and may be from several inches to several feet thick. These do not separate with time but require heat and chemical emulsion breakers. As a result, the rag layer may be delivered to the pipeline which should be almost clean water. If the "rag layer" was pumped to the water cleanup facility it would potentially create difficult problems at that facility.

There are no probes that exist today that can both detect this oil emulsion phase at high water percentages (without calling it 100%) and make an accurate measurement of the water content. This is because the prior art devices are capacitance probes which short-out electrically in this emulsion. Conventional RF/microwave systems are unable to make an accurate measurement because the length of the probe is too long, which causes attenuation and phase length problems. However, improved fluid phase analyzers 100 according to the principles of the present disclosure are capable of such measurements because the measurement electronics are moved out of housing 130 and down into the probe that is immersed in the multi-phase fluid.

The internal capacitances and gain of an active device changes with a change in temperature. This is a key to understanding the temperature compensation requirements for a load pulled oscillator. It is well known that in a typical bipolar transistor the base-to-emitter capacitance (CO, the base-to-collector capacitance ($C_{bc}$), and the collector-to-emitter capacitance ($C_{ce}$) all change with the ambient temperature of the device. This causes an active device creating the oscillations to change its frequency if no element in the feedback loop, such as a crystal, prevents the shift in frequency. Most compensation of oscillators is done to maintain a constant frequency. This compensation deals with the change in the resonant circuit frequency more than the active device parameters. In a load pulled oscillator, a change in load forces a change in frequency, which is key to using the parasitic element as a measurement method. Any compensation method must address the non-linear issues of the active device which brings about a change in frequency versus temperature.

Therefore, understanding the basic reasons for the change in active device internal capacitance is required. The internal capacitances are due to charge storage effects at and near the two junctions of the device. This is the space charge that exists in the region of the pn junction. The width of the region changes depending on the applied bias voltage ($V_{be}$). Diffusion capacitance is capacitance associated with the holes and electrons which exist with different bias in the n and p regions of the device. Junction capacitance is associated with reverse biased pn regions, as seen in field effect transistors, while forward biased diffusion capacitance is seen in bipolar transistors. The diffusion capacitance is related to the base bias current for bipolar transistors. This capacitance is larger than the others and more dependent upon base bias voltage. Therefore, the solution is to vary the base current in order to control the temperature dependence of the load pulled oscillator system. The gate voltage would be the equivalent compensation for a MOSFET or junction FET.

Figure 6A:
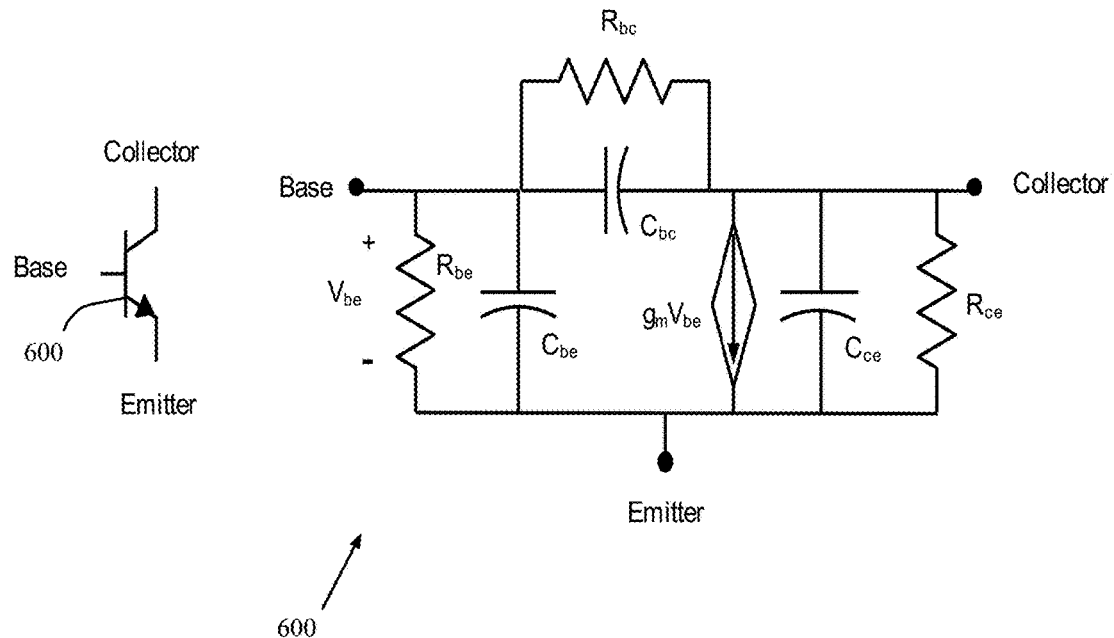
FIG. 6A illustrates the standard model for a bipolar transistor.
Figure 6B:
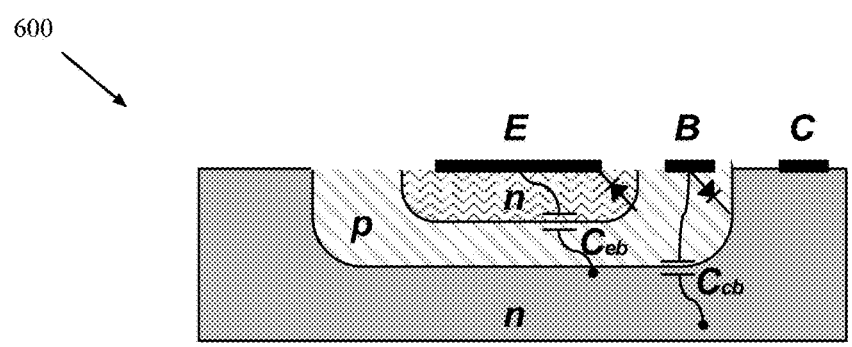
FIG. 6B illustrates the locations of the capacitances and the junction diode structure for the bipolar transistor in FIG. 6A.

FIG. 6A illustrates the standard model for bipolar transistor 600. Transistor 600 has a base (B), a collector (C), and an emitter (E). The various resistances (e.g., $R_{be}$, $R_{bc}$, $R_{ce}$) and capacitances (e.g., $C_{be}$, $C_{bc}$, $C_{ce}$) are intrinsic properties of transistor 600. FIG. 6B illustrates the locations of the intrinsic capacitances and the junction diode structure for bipolar transistor 600 in FIG. 6A.

With the transistor in the active biased mode the base-collector is reverse biased and the base-emitter is forward biased. The collector-emitter capacitance is the sum of the collector-base and the base-emitter capacitances. The base-collector capacitance is depletion in nature. The emitter-base junction has both depletion and diffusion components and this is the larger capacitance which changes with temperature. When a junction is reversed biased, the space charge that exists in the depletion (void of electrons) region is the junction capacitance. Diffusion capacitance is in the forward biased junctions where holes and electrons are exchanged between the p and n types of materials. This is of concern when the temperature changes in a load pulled oscillator active device. A change in the base bias voltage changes this capacitance and compensates for the change in ambient temperature.

Figure 7A:
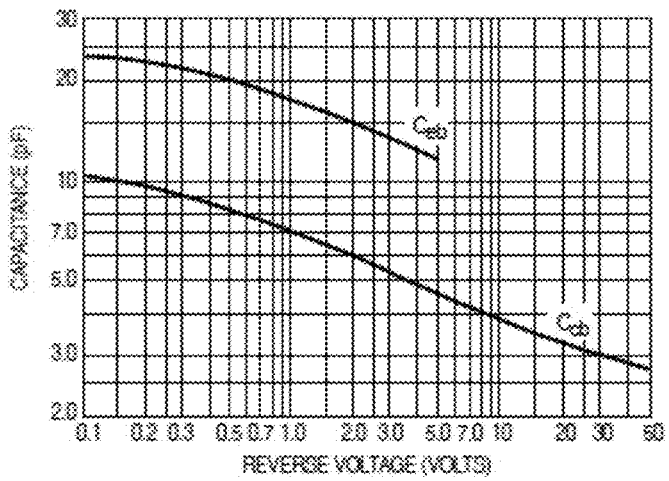
FIG. 7A illustrates the change in capacitance within the junctions of a semiconductor device as noted in a Motorola data sheet for a 2N2222 transistor.

FIG. 7A illustrates the change in capacitance within the junctions of a semiconductor device as noted in a Motorola data sheet for a 2N2222 transistor. FIG. 7A shows the capacitances from emitter to base and from collector to base for various voltages for a reverse biased case. Since the collector-to-base voltage is typically reverse biased, the graph shows the change when the device is used normally. The emitter-to-base voltage is reversed biased in this graph and therefore is only applicable when the device is not in a normal operational mode.

Figure 7B:
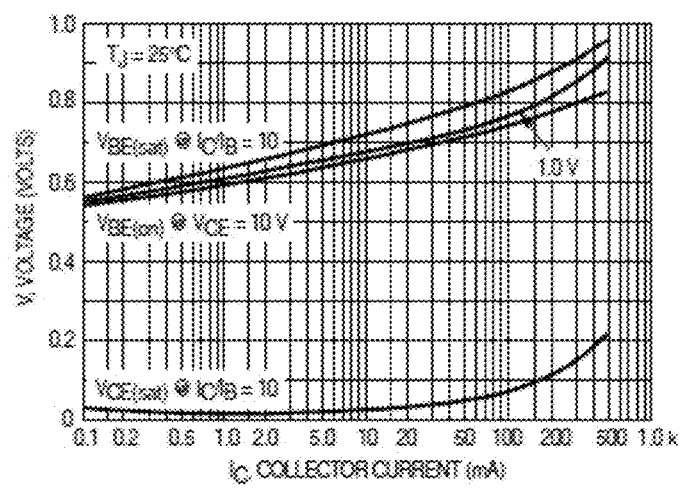
FIG. 7B illustrates the collector currents for various transistor ON voltages as noted in a Motorola data sheet for a 2N2222 transistor.

FIG. 7B illustrates the collector currents for various transistor ON voltages as noted in a Motorola data sheet for a 2N2222 transistor. The base-to-emitter voltage changes for both a typical operational point and the saturated case are shown. The collector-to-emitter voltage for a change in collector current for a saturated transistor is also shown. The only time a device would be operating in a saturated mode is a large signal amplifier or possibly during the swing of an oscillator where the design was to optimize power output. When saturation is achieved, the associated capacitances will increase dramatically. Although a load pulled oscillator design should not reach these points of operation, it is shown here to further detail the dynamic capacitance changes that may occur in an active device.

Figure 7C:
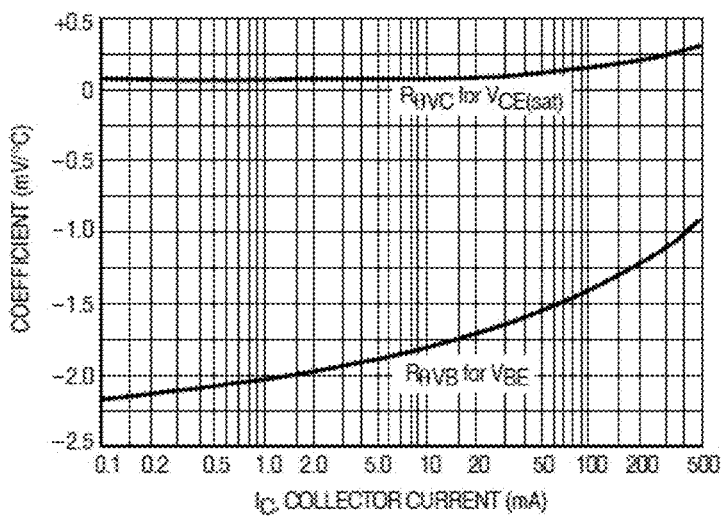
FIG. 7C illustrates the effects of temperature on the junction voltages as noted in a Motorola data sheet for a 2N2222 transistor.

FIG. 7C illustrates the effects of temperature on the junction voltages as noted in a Motorola data sheet for a 2N2222 transistor. The base-to-emitter voltage changes mV/° C. as shown in the graph. These changes versus temperature lead to the changing of the capacitances within the device that causes the optimal operational point of the load pulled active device to change.

Figure 7D:
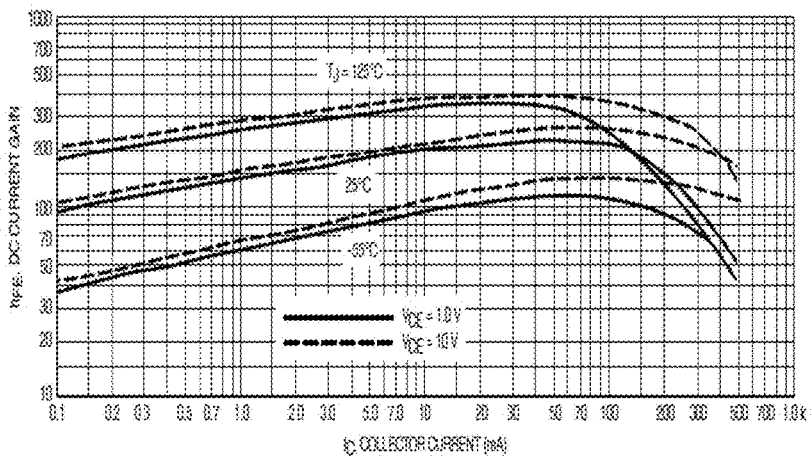
FIG. 7D illustrates the effects of temperature on the DC current gain as noted in a Motorola data sheet for a 2N2222 transistor.

FIG. 7D illustrates the effects of temperature on the DC current gain as noted in a Motorola data sheet for a 2N2222 transistor. These changes versus temperature lead to the changing of the capacitances within the device that causes the optimal operational point of the load pulled active device to change.

Figure 8:
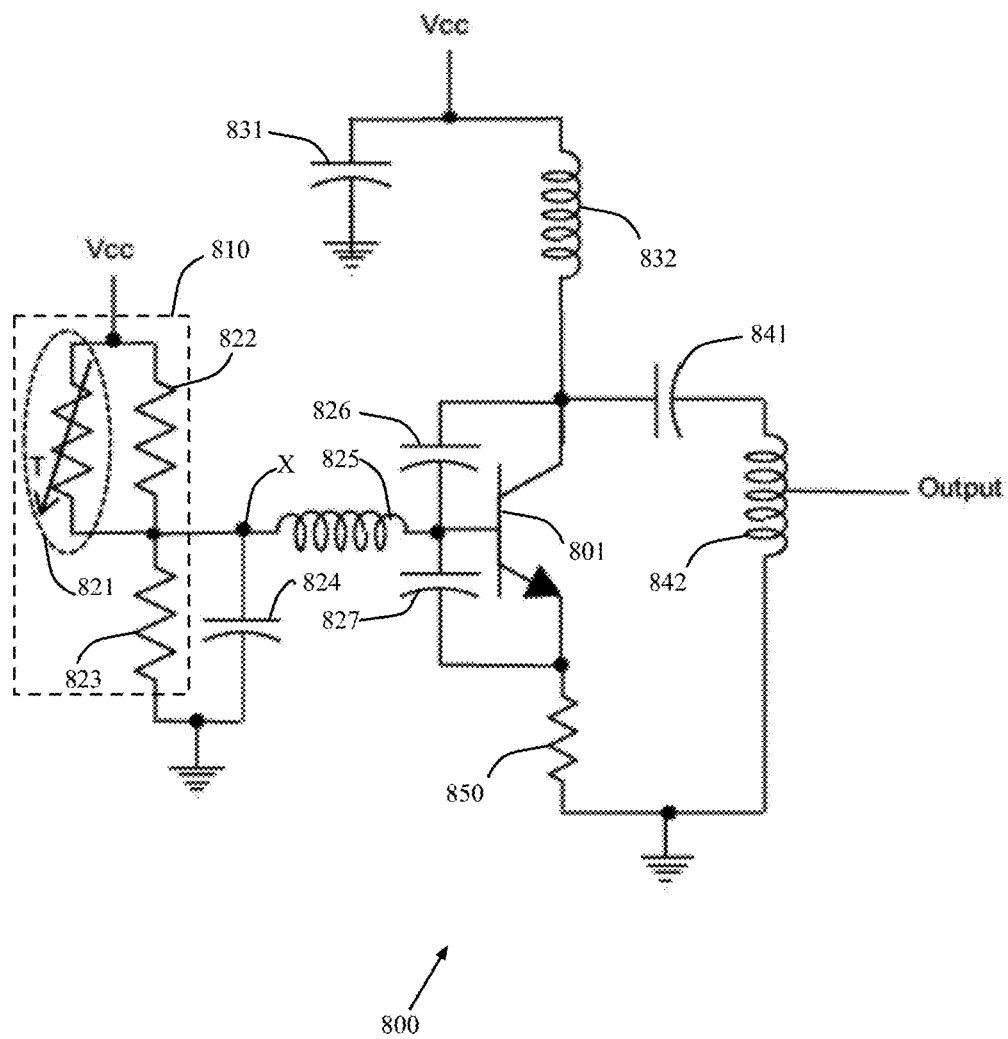
FIG. 8 illustrates load pulled oscillator circuit that uses a thermistor to provide temperature compensation of the load pulled active device according to the principles of the present disclosure.

FIG. 8 illustrates load pulled oscillator circuit 800, which uses thermistor 821 to provide temperature compensation according to the principles of the present disclosure. Thermistor 821 is one example of temperature sensing element 450 above. Load pulled oscillator circuit 800 comprises load pulled transistor 801, thermistor 821, resistors 822, 823, and 850, capacitors 824, 826, 827, 831, and 841, and inductors 825, 832, and 842. Thermistor 821 is a resistor that is sensitive to a change in temperature. The change in resistance may be negative or positive depending on the temperature coefficient of the device. Because of their stable response to temperature, thermistors are a very reliable device to compensate for variations within circuits requiring temperature compensation.

The present disclosure does not require that thermistor 821 be implemented in a particular architecture for oscillator circuit 800. By way of example, oscillator circuit 800 may be similar, but not identical, in architecture and operation to oscillator 30 in FIG. 1 of U.S. Pat. No. 4,862,060, incorporated by reference above. Oscillator circuit 800 includes temperature compensation circuit 810, comprising thermistor 821, resistor 822, and resistor 823, a tuning circuit comprising capacitor 824 and inductor 825. The tuning circuit provides a bias voltage to the base of load pulled transistor 801. Oscillator circuit 800 further includes an active circuit comprising load pulled transistor 801, capacitors 826 and 827, resistor 850, capacitor 831, and inductor 832. Finally, oscillator circuit 800 includes an impedance matching network circuit comprising capacitor 841, and inductor 842.

In operation, oscillator circuit 800 operates at a particular frequency of oscillation (i.e., a quiescent operating point) associated with an ideal matched impedance. The particular frequency of oscillation may also be referred to as a "target frequency", a "selected frequency", an "optimal frequency", or the like. For simplicity, the particular frequency of oscillation may be referred to herein as the "optimal operational bias point".

Thermistor 821 is in parallel with resistor 822, so that the effective resistance of the parallel combination is determined by the resistance of thermistor 821, which varies by temperature. Thermistor 821 and resistors 822 and 823 provide a voltage divider between ground and Vcc. Thus, the voltage at the node X between resistor 823 and the parallel combination of thermistor 821 and resistor 822 will also vary with temperature. Node X is also the midpoint between capacitor 824 and inductor 825, which control the input bias voltage and oscillation of load pulled transistor 801. Thus, the voltage variation at node X affects the internal junction capacitances of load pulled transistor 801 and therefore affects the frequency of oscillation of load pulled oscillator circuit 800.

Using a thermistor in temperature compensation circuit 810 for the load pulled oscillator may result in affecting an associated change in the internal junction capacitances of active load pulled transistor 801. In this manner, the change in ambient temperature of the active device, which creates a change in its internal capacitances, can be compensated for by adjusting the quiescent operating point with thermistor 821. It is possible that more than one thermistor 821 may be used to best compensate. In such a case, one thermistor 821 might be in the base bias circuitry (as in FIG. 8) and at least one other thermistor 821 (not shown) may be connected in the collector or emitter, or both. Therefore, a change in the voltage between the various junctions effects a change in capacitance, which offsets the change in capacitance created by the ambient temperature change.

Those skilled in the art will readily understand that alternative circuit layouts may be substituted for load pulled oscillator circuit 800 without departing from the scope and teaching of the present disclosure. Additionally, thermistor 821 may be replaced by another active device (i.e., a transistor) that is matched to the active device (i.e., load pulled transistor 801) in the active circuit in FIG. 8.

Figure 9:
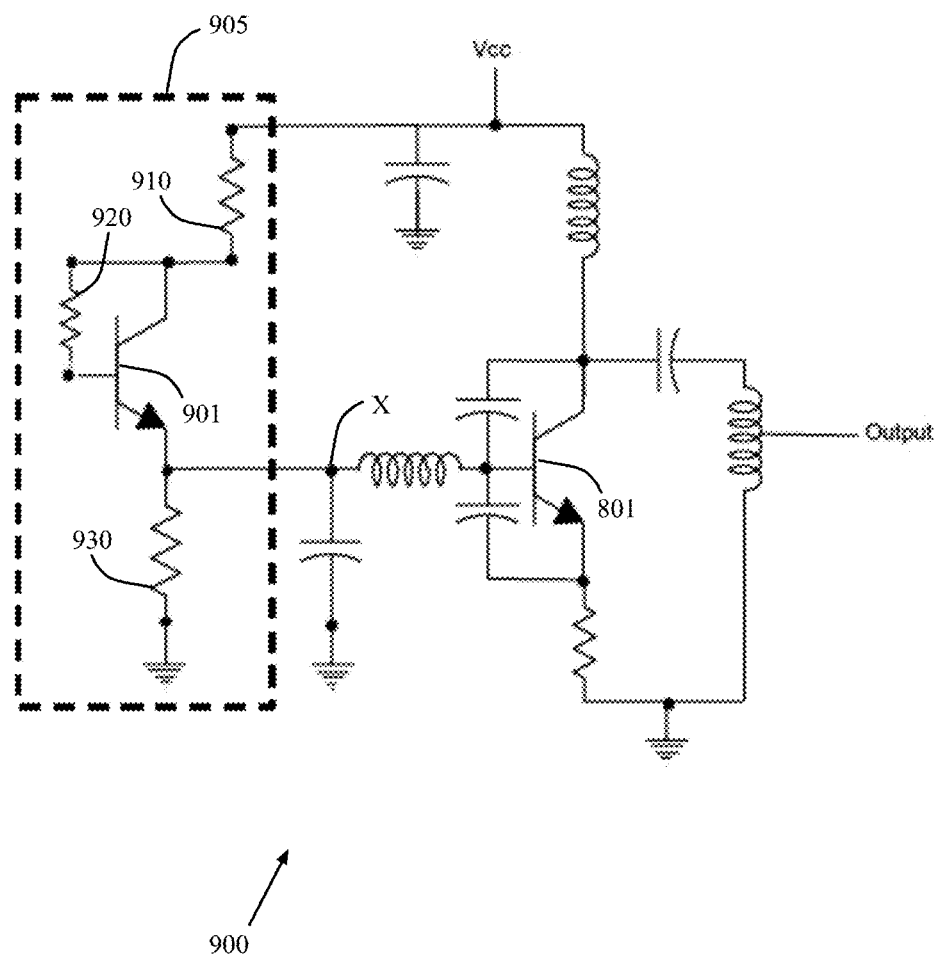
FIG. 9 illustrates load pulled oscillator circuit that uses an active device to provide temperature compensation of the load pulled active device according to the principles of the present disclosure.

FIG. 9 illustrates load pulled oscillator circuit 900 that uses an active device to provide temperature compensation according to the principles of the present disclosure. In FIG. 9, temperature compensation circuit 810 has been replaced by temperature compensation circuit 905. Temperature compensation circuit 905 comprises temperature compensation transistor 901 (i.e., an active device), and resistors 910, 920, and 930.

There is no need for a thermistor in load pulled oscillator circuit 900 because the junction of temperature compensation transistor 901 becomes the temperature sensor. The advantage of this configuration is that the two active devices (i.e., transistors 801 and 901) may be the same type of transistor. For example, if the active oscillator device (i.e., load pulled oscillator transistor 801) is a 2N2222 transistor, then the temperature compensation device (i.e., temperature compensation transistor 901) may be the same type of device. The changes in gain and junction voltages caused by temperature variation will be the same for both devices. Therefore, the temperature compensation will be very good. The remaining portions of load pulled oscillator circuit 900 are the same as load pulled oscillator circuit 800 and need not be discussed separately.

Those skilled in the art will understand that biased junction transistors (BJTs) in FIGS. 8 and 9 may be replaced by field effect transistors (FETs) without departing from the scope and teaching of the disclosure. Thus, load pulled BJT 801 may be replaced by load pulled FET 801 and load pulled BJT 901 may be replaced by load pulled FET 901. In embodiments using FET devices, the gate of the FET device is coupled in the same manner as the base of the BJT device, the drain of the FET device is coupled in the same manner as the collector of the BJT device, and the source of the FET device is coupled in the same manner as the emitter of the BJT device.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A load pulled oscillator circuit comprising:
an active circuit comprising a load pulled oscillator transistor, the active circuit having an optimal operational bias point;
an impedance matching circuit coupled to the active circuit; and
a temperature compensation circuit coupled to the active circuit and configured to compensate a bias voltage to the active circuit to thereby maintain the optimal operational bias point, wherein the temperature compensation circuit comprises a first thermistor that provides a variable resistance according to an ambient temperature in which the active circuit operates and wherein the variable resistance of the first thermistor compensates for changes in the ambient temperature to thereby maintain the optimal operational bias point, wherein the load pulled oscillator transistor comprises one of:
a biased junction transistor, wherein the temperature compensation circuit is coupled to a base of the biased junction transistor, and at least a second thermistor coupled to at least one of a collector of the biased junction transistor and an emitter of the biased junction transistor; or
a field effect transistor, wherein the temperature compensation circuit is coupled to a gate of the field effect transistor, and at least a second thermistor coupled to at least one of a source of the field effect transistor and a drain of the field effect transistor.

2. A load pulled oscillator circuit comprising:
an active circuit comprising a load pulled oscillator transistor, the active circuit having an optimal operational bias point;
an impedance matching circuit coupled to the active circuit; and
a temperature compensation circuit coupled to the active circuit and configured to compensate a bias voltage to the active circuit to thereby maintain the optimal operational bias point, wherein the temperature compensation circuit comprises a first temperature compensation transistor matched to the load pulled oscillator transistor, wherein a gain value of the first temperature compensation transistor varies with changes in an ambient temperature in which the active circuit operates such that the first temperature compensation transistor compensates for changes in the ambient temperature to thereby maintain the optimal operational bias point, wherein the load pulled oscillator transistor comprises one of:
a biased junction transistor, wherein the temperature compensation transistor is coupled to a base of the biased junction transistor, and at least a second temperature compensation transistor coupled to at least one of a collector of the biased junction transistor and an emitter of the biased junction transistor; or
a field effect transistor, wherein the temperature compensation circuit is coupled to a gate of the field effect transistor, and at least a second temperature compensation transistor coupled to at least one of a source of the field effect transistor and a drain of the field effect transistor.

3. An apparatus for analyzing a multiphase fluid in a pipeline comprising:

an elongated shaft adapted to be inserted into the pipeline, the elongated shaft comprising a measurement electronics section and an extension section;

a housing coupled to the elongated shaft and adapted to be positioned outside the pipeline when the elongated shaft is inserted into the pipeline; and a ground cage coupled to the elongated shaft, the ground cage comprising a sensor coupled to the measurement electronics section, wherein the measurement electronics section comprises a load pulled oscillator circuit including:

an active circuit comprising a load pulled oscillator transistor, the active circuit having an optimal operational bias point;

an impedance matching circuit coupled to the active circuit; and a temperature compensation circuit coupled to the active circuit and configured to compensate a bias voltage to the active circuit to thereby maintain the optimal operational bias point, wherein the temperature compensation circuit comprises a first thermistor that provides a variable resistance according to an ambient temperature in which the active circuit operates and wherein the variable resistance of the first thermistor compensates for changes in the ambient temperature to thereby maintain the optimal operational bias point, wherein the load pulled oscillator transistor comprises one of:

a biased junction transistor, wherein the temperature compensation circuit is coupled to a base of the biased junction transistor, and at least a second thermistor coupled to at least one of a collector of the biased junction transistor and an emitter of the biased junction transistor; or a field effect transistor, wherein the temperature compensation circuit is coupled to a gate of the field effect transistor, and at least a second thermistor coupled to at least one of a source of the field effect transistor and a drain of the field effect transistor.

* * * * *